United States Patent
Hsiao et al.

(10) Patent No.: US 9,806,150 B2
(45) Date of Patent: Oct. 31, 2017

(54) HIGH VOLTAGE DEVICE AND METHOD OF FABRICATING THE SAME

(71) Applicant: UNITED MICROELECTRONICS CORP., Hsin-Chu (TW)

(72) Inventors: Shih-Yin Hsiao, Chiayi County (TW); Su-Hwa Tsai, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/587,378

(22) Filed: May 4, 2017

(65) Prior Publication Data
US 2017/0236899 A1  Aug. 17, 2017

Related U.S. Application Data

(62) Division of application No. 15/015,142, filed on Feb. 4, 2016, now Pat. No. 9,680,010.

(51) Int. Cl.
| | |
|---|---|
| H01L 21/336 | (2006.01) |
| H01L 29/66 | (2006.01) |
| H01L 29/06 | (2006.01) |
| H01L 27/088 | (2006.01) |
| H01L 29/78 | (2006.01) |
| H01L 29/10 | (2006.01) |
| H01L 29/40 | (2006.01) |
| H01L 21/8234 | (2006.01) |
| H01L 21/3065 | (2006.01) |
| H01L 21/308 | (2006.01) |

(52) U.S. Cl.
CPC ........ H01L 29/0661 (2013.01); H01L 21/308 (2013.01); H01L 21/3065 (2013.01); H01L 21/8234 (2013.01); H01L 27/088 (2013.01); H01L 29/1095 (2013.01); H01L 29/408 (2013.01); H01L 29/66681 (2013.01); H01L 29/7816 (2013.01)

(58) Field of Classification Search
CPC ................ H01L 29/7816; H01L 29/66613
USPC ................ 438/159, 262, 286; 257/328, 335
See application file for complete search history.

(56) References Cited

U.S. PATENT DOCUMENTS

| | | | |
|---|---|---|---|
| 7,777,524 B2 | 8/2010 | Jeon | |
| 7,824,977 B2 | 11/2010 | Hu | |
| 7,884,440 B2 | 2/2011 | Chung | |
| 7,989,232 B2 | 8/2011 | Wang | |
| 8,278,710 B2* | 10/2012 | Khemka | H01L 29/1083 257/335 |
| 8,674,441 B2 | 3/2014 | Chen | |

(Continued)

*Primary Examiner* — Calvin Lee
(74) *Attorney, Agent, or Firm* — Winston Hsu

(57) ABSTRACT

A high voltage device includes a substrate, a first LDMOS transistor and a second LDMOS transistor disposed on the substrate. The first LDMOS transistor includes a first gate electrode disposed on the substrate. A first STI is embedded in the substrate and disposed at an edge of the first gate electrode and two first doping regions respectively disposed at one side of the first STI and one side of the first gate electrode. The second LDMOS transistor includes a second gate electrode disposed on the substrate. A second STI is embedded in the substrate and disposed at an edge of the second gate electrode. Two second doping regions are respectively disposed at one side of the second STI and one side of the second gate electrode, wherein the second STI is deeper than the first STI.

11 Claims, 10 Drawing Sheets

(56) References Cited

U.S. PATENT DOCUMENTS

| | | |
|---|---|---|
| 8,704,329 B2 | 4/2014 | Qiao |
| 8,853,091 B2 | 10/2014 | Sato |
| 9,214,548 B1 | 12/2015 | Kim |
| 9,680,010 B1 * | 6/2017 | Hsiao .................. H01L 29/7816 257/335 |
| 2007/0054464 A1 | 3/2007 | Zhang |
| 2009/0302413 A1 | 12/2009 | Kang |
| 2013/0344678 A1 | 12/2013 | Oh |

* cited by examiner

HIGH VOLTAGE DEVICE AND METHOD OF FABRICATING THE SAME

CROSS REFERENCE TO RELATED APPLICATIONS

This patent application is a divisional application of and claims priority to U.S. patent application Ser. No. 15/015,142, filed on Feb. 4, 2016, now U.S. Pat. No. 9,680,010 issued Jun. 13, 2017, and entitled "HIGH VOLTAGE DEVICE AND METHOD OF FABRICATING THE SAME," the entire contents of which are incorporated herein by reference.

BACKGROUND OF THE INVENTION

1. Field of the Invention

The present invention relates to a high voltage device and method of fabricating the same, and more particularly to a lateral double diffused metal oxide semiconductor (LDMOS) transistor structure and method of fabricating the same.

2. Description of the Prior Art

High voltage devices are well known devices which form an integral part of modern day display panels, telecommunication systems, motor controllers, switch lock power supplies, inverters, and the like, by functioning as high voltage drivers. Due to the high voltage characteristics associated with these applications, the high voltage devices are required to have the capacity to withstand large supply voltages, sometimes in excess of 450 volts, without exhibiting breakdown.

Conventional high voltage devices include an isolator underneath the edge of the gate to improve the breakdown voltage of the device. Breakdown is believed to occur at the silicon surface underneath the gate edge when it has severe electric field crowding. The isolator can help to distribute the potential voltage drop; however, the on-resistance (Ron) is increased significantly by a deeper isolator because of the extra current path underneath the isolator. Ron is an important parameter, related to power loss. Low Ron is desirable for high voltage transistors.

SUMMARY OF THE INVENTION

In light of the above, a principal object of the present invention is to provide a method of fabricating a high voltage device which has low Ron and high breakdown voltage.

A method of fabricating a high voltage device includes providing a substrate comprising a high voltage device region and a low voltage device region. A preliminary first gate electrode and a second gate electrode are formed on the substrate within the high voltage device region. After forming the preliminary first gate electrode and the second gate electrode, a first trench and a second trench are formed and embedded in the substrate and a first gate electrode, wherein the second trench is deeper than the first trench, the first trench is under an edge of the first gate electrode and the second trench is under an edge of the second gate electrode. Finally, an insulating layer such as a silicon oxide layer is formed to fill in the first trench and the second trench to form a first STI and a second STI.

A high voltage device includes a substrate and a first LDMOS transistor disposed on the substrate. The first LDMOS transistor includes a first gate electrode disposed on the substrate. A first STI is embedded in the substrate and disposed at an edge of the first gate electrode and two first doping regions respectively disposed at one side of the first STI and one side of the first gate electrode. A second LDMOS transistor is disposed on the substrate. The second LDMOS transistor includes a second gate electrode disposed on the substrate. A second STI is embedded in the substrate and disposed at an edge of the second gate electrode. Two second doping regions are respectively disposed at one side of the second STI and one side of the second gate electrode, wherein the second STI is deeper than the first STI.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a method of fabricating a high voltage device showing successive stages according to a first preferred embodiment of the present invention, wherein:

FIG. 1 depicts a stage of providing substrate with STIs;

FIG. 2 depicts a stage of forming a preliminary first gate electrode, a second gate electrode, a third gate electrode and a low voltage gate electrode;

FIG. 3 depicts a stage of forming a patterned mask layer;

FIG. 4 depicts a stage of forming a first trench and a second trench;

FIG. 5 depicts a stage of forming a first drift region and a second drift region;

FIG. 6 depicts a stage of forming spacers;

FIG. 7 depicts a stage of performing an implantation process; and

FIG. 8 depicts a stage of forming a filling layer.

FIG. 9 to FIG. 10 depict a method of fabricating a high voltage device showing successive stages according to a second preferred embodiment of the present invention, wherein:

FIG. 9 depicts a stage of forming a patterned mask layer; and

FIG. 10 depicts a stage of completing the high voltage device.

DETAILED DESCRIPTION

Figure 1:
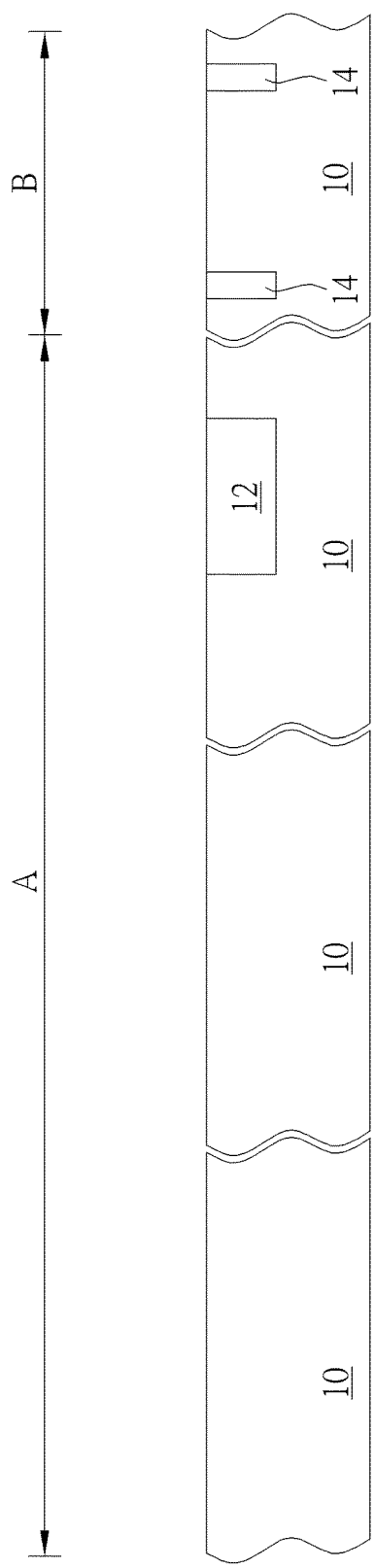

FIG. 1 to FIG. 8 depict a method of fabricating a high voltage device according to a first preferred embodiment of the present invention. As shown in FIG. 1, a substrate 10 is provided. The substrate 10 includes a high voltage device region A and a low voltage device region B. A third STI 12 is then formed in the high voltage device region A and at least a fourth STI 14 is formed in the low voltage device region B. The third STI 12 and the fourth STI 14 are formed simultaneously. The third STI 12 and the fourth STI 14 have substantially the same depth. Both the third STI 12 and the fourth STI 14 include silicon oxide as a filling.

Figure 2:
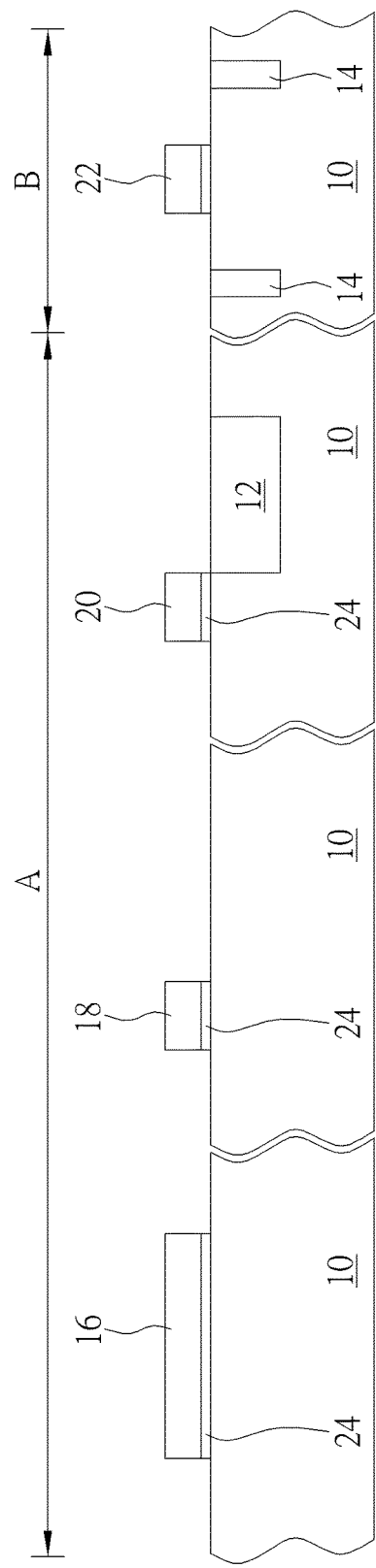

As shown in FIG. 2, a preliminary first gate electrode 16, a second gate electrode 18, a third gate electrode 20 and a low voltage gate electrode 22 are formed on the substrate 10 simultaneously. Dielectric layers 24 are respectively disposed between the preliminary first gate electrode 16 and the substrate 10, the second gate electrode 18 and the substrate 10, the third gate electrode 20 and the substrate 10, and the low voltage gate electrode 22 and the substrate 10. The preliminary first gate electrode 16, the second gate electrode 18, the third gate electrode 20 and the low voltage gate electrode 22 are preferably made of polysilicon. Each of the dielectric layers 24 may be independently selected from insulating materials such as silicon oxide, silicon nitride, silicon carbide nitride, silicon oxynitride, high-k dielectrics or any combination thereof. The dielectric layers 24 within high voltage device region A may be thicker than the dielectric layer 24 within the low voltage device region B. The dielectric layers 24 with high voltage device region A may be made of different materials from the dielectric layer 24 within the low voltage device region B.

In detail, the preliminary first gate electrode 16, a second gate electrode 18, a third gate electrode 20 and a low voltage gate electrode 22 can be formed by blanketly forming a polysilicon layer (not shown) which covers the substrate 10 and then patterning the polysilicon layer.

Figure 3:
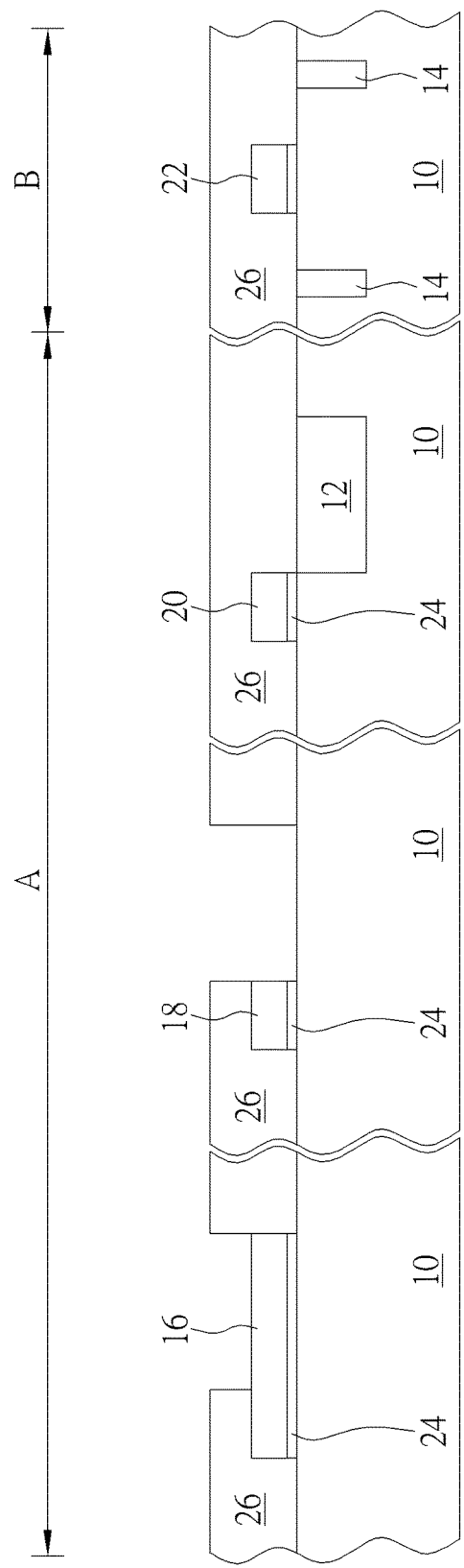

As shown in FIG. 3, a patterned mask layer 26 such as a patterned photoresist layer is formed to cover part of the substrate 10, part of the preliminary first gate electrode 16, the second gate electrode 18, the third gate electrode 20 and the low voltage gate electrode 22. Specifically, part of the preliminary first gate electrode 16 and the substrate 10 next to the second gate electrode 18 are exposed through the patterned mask layer 26.

Figure 4:
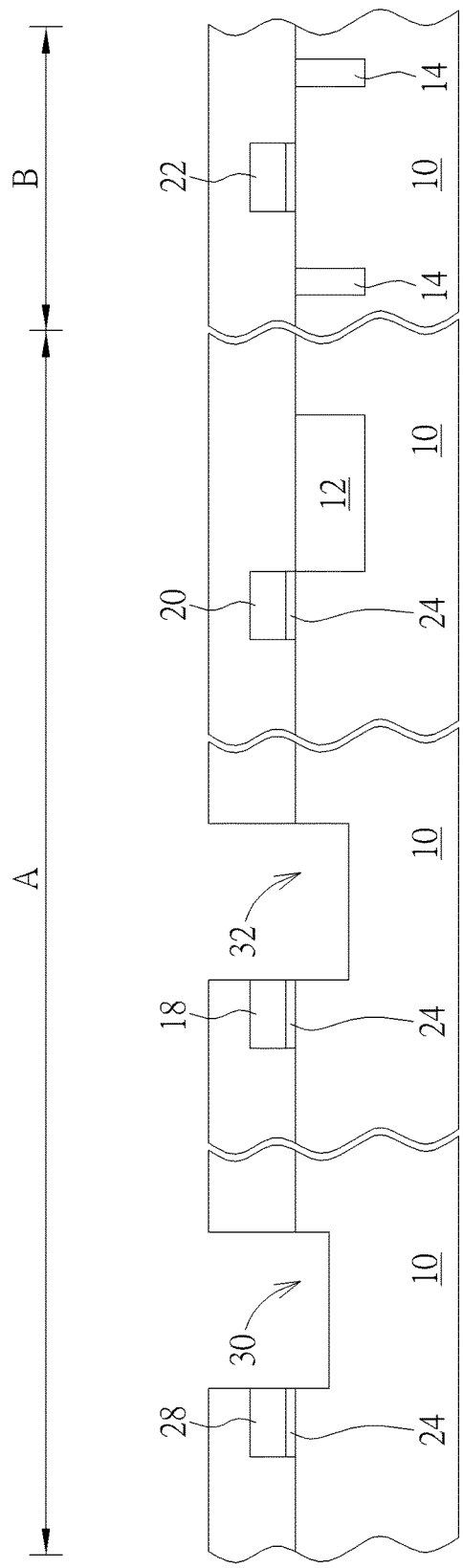

As shown in FIG. 4, one or more etching processes are performed to etch the exposed preliminary first gate electrode 16 and the exposed substrate 10 simultaneously by taking the patterned mask layer 26 as a mask layer. After the exposed preliminary first gate electrode 16 is entirely removed, the remaining preliminary first gate electrode 16 becomes a first gate electrode 28. After the formation of the first gate electrode 28, the etching process continues to etch the substrate 10 beside the first gate electrode 28 while the substrate 10 beside the second gate electrode 18 is also etched to form a first trench 30 and a second trench 32 in the substrate 10. The first trench 30 is below an edge of the first gate electrode 28 and the second trench 32 is below an edge of the second gate electrode 18. During the etching process, part of the preliminary first gate electrode 16, part of the substrate 10 beside the second gate electrode 18 and part of the substrate 10 beside the first gate electrode 28 are removed to form the first trench 30 and the second trench 32 within the high voltage device region A.

Figure 5:
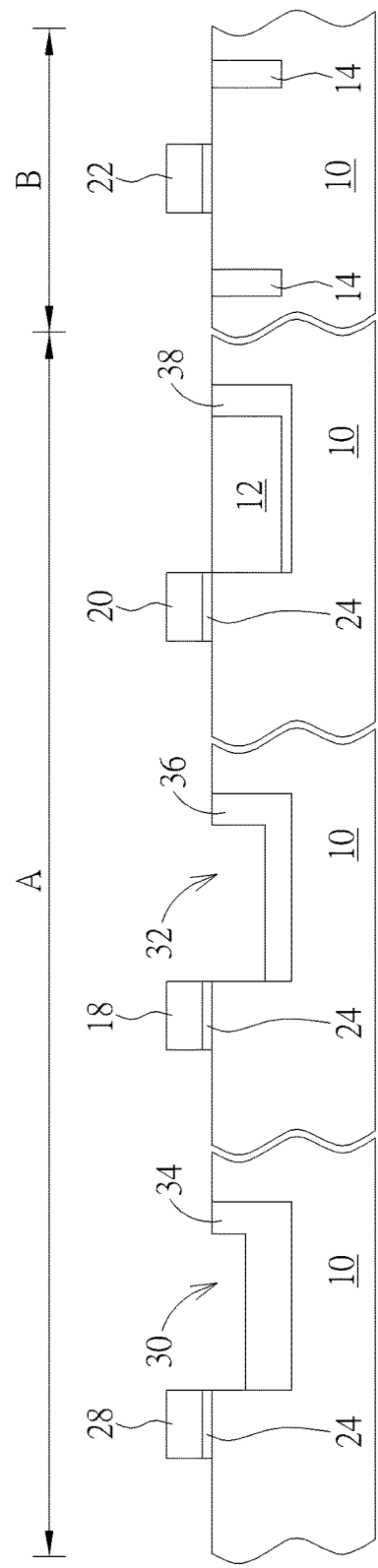

As shown in FIG. 5, the patterned mask layer is removed. Later, a mask layer (not shown) is formed to entirely cover the low voltage device region B, and cover part of the high voltage device region A to respectively expose regions at one side of the first gate electrode 28, one side of the second gate electrode 18 and one side of the third gate electrode 20. Subsequently, an implantation process is performed to form a first drift region 34, a second drift region 36 and a third drift region 38 around the first trench 30, the second trench 32 and the third STI 12, respectively. The implantation process includes implanting n-type or p-type dopants into the substrate 10. Then, the mask layer is removed.

Figure 6:
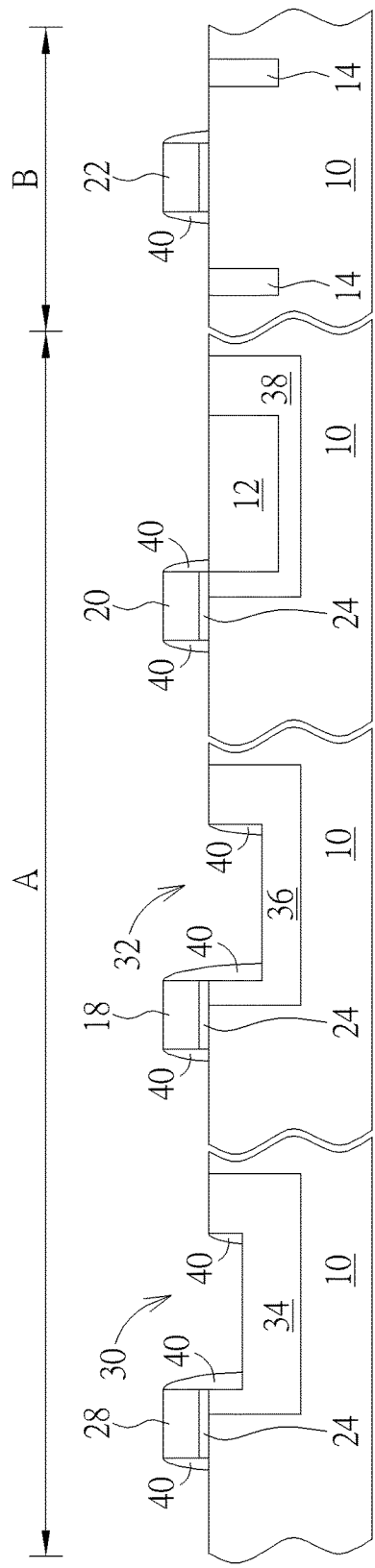

As shown in FIG. 6, a drive-in diffusion step is optionally applied to the first drift region 34, the second drift region 36 and the third drift region 38. Therefore, part of the first drift region 34 overlaps with the first gate electrode 28, part of the second drift region 36 overlaps with the second gate electrode 18 and part of the third drift region 38 overlaps with the third gate electrode 20. Later, an insulating layer (not shown) is formed to conformally cover the first gate electrode 28, the first trench 30, the second gate electrode 18, the second trench 32, the third gate electrode 20, the third STI 12, the low voltage gate electrode 22, the fourth STI 14 and the substrate 10. After that, the insulating layer is anisotropically etched to form spacers 40 around the first gate electrode 28, the second gate electrode 18, the third gate electrode 20, and the low voltage gate electrode 22. The spacers 40 are also formed at two sides of the first trench 30 and at two sides of the second trench 32. In detail, one of the spacers 40 on the first gate electrode 28 extends to one sidewall of the first trench 30, i.e. the first gate electrode 28 and the first trench 30 share one of the spacers 40. Similarly, one of the spacers 40 on the second gate electrode 18 extends to one sidewall of the second trench 32. Therefore, the second gate electrode 18 and the second trench 32 share one of the spacers 40.

Figure 7:
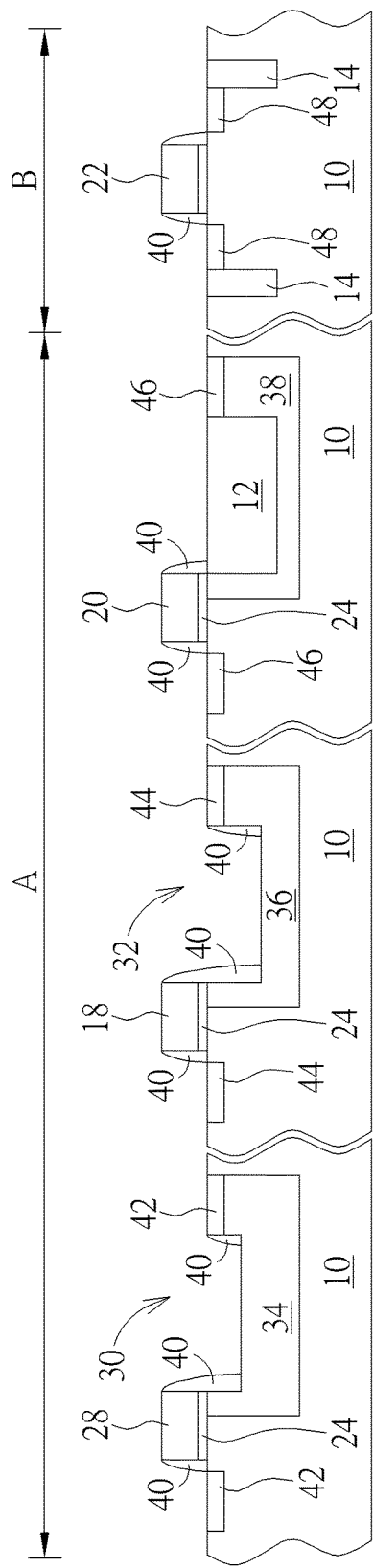

As shown in FIG. 7, first doping regions 42, second doping regions 44, third doping regions 46 and fourth doping regions 48 are formed. In detail, the first doping regions 42 are respectively disposed in the substrate 10 at one side of the first trench 30 and one side of the first gate electrode 28, the second doping regions 44 are respectively disposed in the substrate 10 at one side of the second trench 32 and one side of the second gate electrode 18, the third doping regions 46 are respectively disposed in the substrate 10 at one side of the third STI 12 and one side of the third gate electrode 20 and the fourth doping regions 48 are respectively disposed in the substrate 10 at two sides of the low voltage gate electrode 22. The first doping regions 42, the second doping regions 44, and the third doping regions 46 may be formed by the same or different implantation processes, based on the conductive type of the first doping regions 42, the second doping regions 44 and the third doping regions 46. The fourth doping regions 48 may be formed by the same implantation process for forming the first doping regions 42, the second doping regions 44, and the third doping regions 46 or the fourth doping regions 48 may be formed by another implantation process different from the implantation process for forming the first doping regions 42, the second doping regions 44, and the third doping regions 46. The implantation process (es) includes implanting n-type or p-type dopants into the substrate 10.

After the third doping regions 46 and the fourth doping regions 48 are formed, a third LDMOS transistor 50 and an LVMOS (low voltage metal oxide semiconductor) transistor 52 are completed. The third doping regions 46 and the fourth doping regions 48 serve as source/drain doping regions of the third LDMOS transistor 50 and the LVMOS transistor 52, respectively.

The third LDMOS transistor 50 preferably includes the third gate electrode 20, the dielectric layer 24, the third STI 12, the third doping regions 46 and the third drift region 38. The LVMOS transistor 52 preferably includes the low voltage gate electrode 22, the dielectric layer 24, and the fourth doping regions 48. The first doping regions 42 and the second doping regions 44 will serve as source/drain doping regions for LDMOS transistors formed afterwards.

Figure 8:
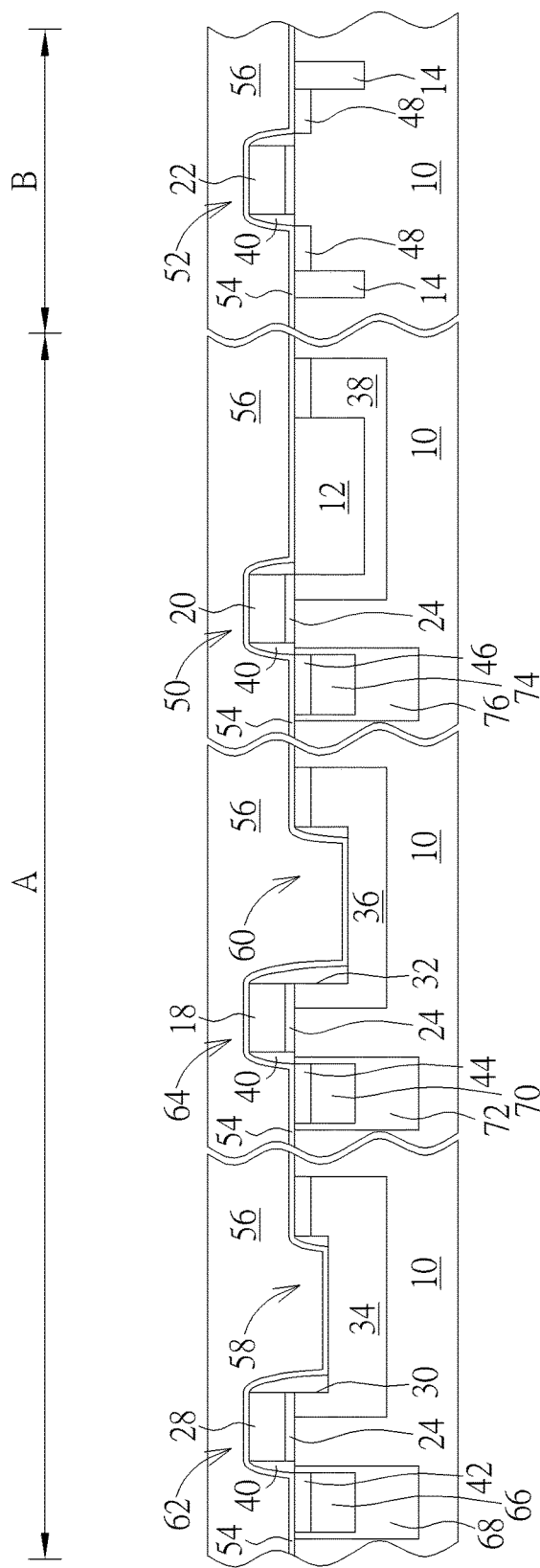

As shown in FIG. 8, an etching stop layer 54 such as silicon nitride is formed conformally to cover the first gate electrode 28, the first trench 30, the second gate electrode 18, the second trench 32, the spacers 40, the substrate 10, the third LDMOS transistor 50 and the LVMOS transistor 52. The etching stop layer 54 may comprises stress. Then, a filling layer 56 such an insulating layer is formed to fill in the first trench 30 and the second trench 32, and cover the etching stop layer 54. In detail, the filling layer 56 fills in the first trench 30 and second trench 32, and covers the first gate electrode 28, the second gate electrode 18, the third LDMOS transistor 50, the LVMOS transistor 52 and the substrate 10.

The filling layer 56 preferably comprises one or more silicon oxide layers. A top surface of the filling layer 56 is higher than the top surface of the first gate electrode 28. After the filling layer 56 fills in the first trench 30 and the second trench 32, an optional chemical mechanical polishing is performed to form a global planar upper surface and a first STI 58 and a second STI 60. At this point, a first LDMOS transistor 62 and a second LDMOS transistor 64 are completed. The first LDMOS transistor 62 includes the first gate electrode 28, the dielectric layer 24, the first STI 58, the first doping regions 42, and first drift region 34. The second LDMOS transistor 64 includes the second gate electrode 18, the dielectric layer 24, the second STI 60, the second doping regions 44, and second drift region 36.

It is noteworthy that the filling layer 56 serves as fillings of the first STI 58 and the second STI 60. Furthermore, the filling layer 56 also serves as an interlayer dielectric on the first LDMOS transistor 62, the second LDMOS transistor 64, the third LDMOS transistor 50 and the LVMOS transistor 52. In other words, the interlayer dielectric on the first LDMOS transistor 62, the second LDMOS transistor 64, the third LDMOS transistor 50 and the LVMOS transistor 52 are the same as filling layer 56 for the first STI 58 and the second STI 60.

The second STI 60 is deeper than the first STI 58 because the preliminary first gate electrode 16 serves as a sacrificial layer for forming the first trench 30 and is consumed while forming the second trench 32. After the preliminary first gate electrode 16 is consumed, the etching process starts to etch the substrate 10 to form the first trench 30 while part of the second trench 32 is already formed.

Figure 9:
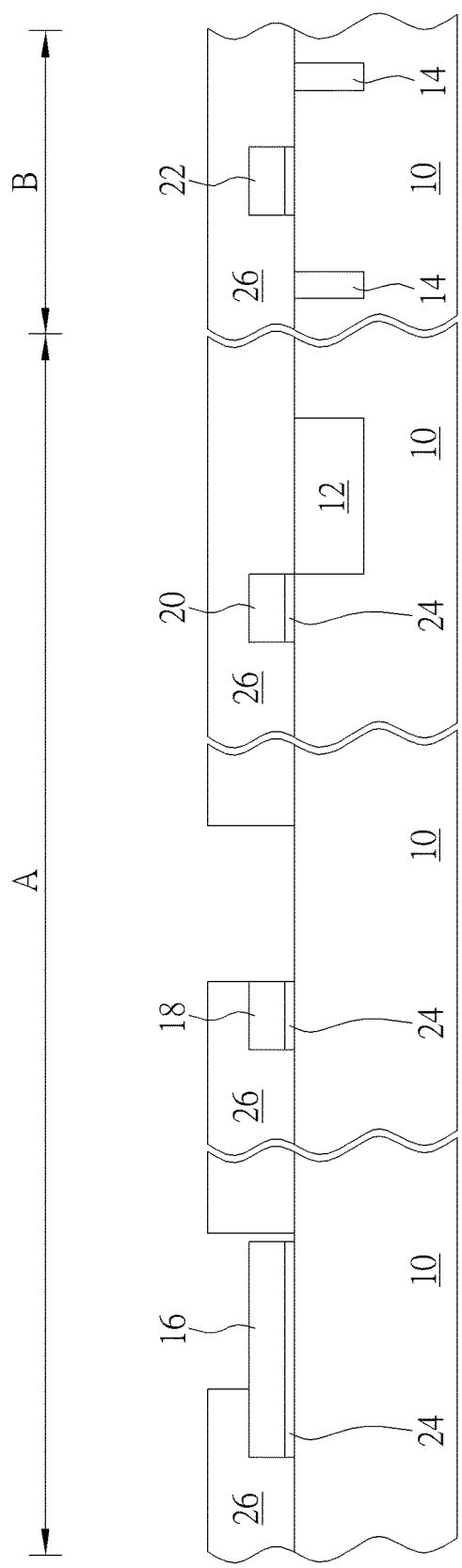
Figure 10:
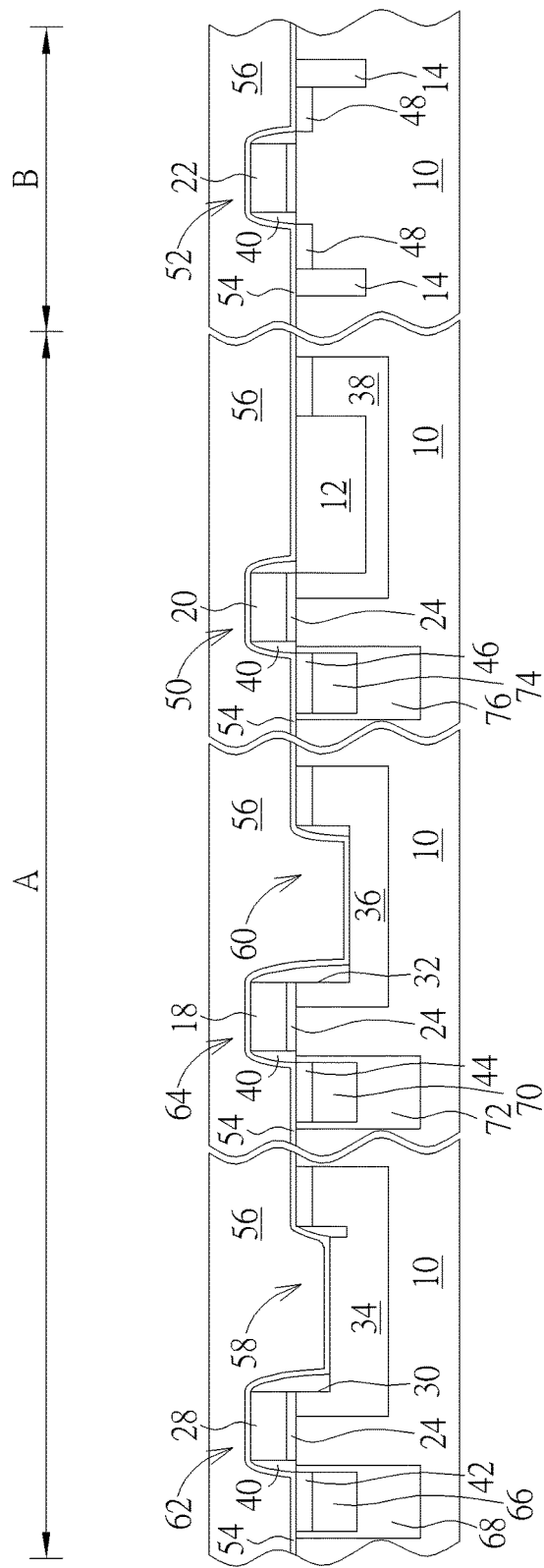

FIG. 9 to FIG. 10 depict a method of fabricating a high voltage device according to a second preferred embodiment of the present invention, wherein the same reference numerals are used to refer to like elements. The difference between the second preferred embodiment and the first preferred embodiment is that a profile of a bottom of the first STI 58 in the second preferred embodiment is uneven, and a profile of a bottom of the first STI 58 in the first preferred embodiment is flat.

As shown in FIG. 9, in order to make sure the part of the preliminary first gate electrode 16 serving as the sacrificial layer will be removed entirely, the opening of the patterned mask layer 26 in FIG. 9 is wider compared to the opening of the pattered mask layer 26 in FIG. 3 to prevent shifting of the photolithography mask when forming the patterned mask layer 26 in FIG. 9. In this way, the substrate 10 beside the preliminary first gate electrode 16 is also exposed through the patterned mask layer 16, so the exposed substrate 10 is etched while the preliminary first gate electrode 16 is etched. Other fabricating processes in the second preferred embodiment are the same as those in the first preferred embodiment. As a result, a profile of the bottom of the first STI 58 in FIG. 10 is uneven.

According to a third preferred embodiment, an LDMOS transistor structure is provided. The LDMOS transistor structure is formed by the fabricating method illustrated in the first preferred embodiment.

As shown in FIG. 8, the LDMOS transistor structure 100 includes a substrate 10. The substrate 10 includes a high voltage device region A and a low voltage device region B. A first LDMOS transistor 62, a second LDMOS transistor 64 and a third LDMOS transistor 50 are disposed on the substrate 10 within the high voltage device region A. The LDMOS transistor structure 100 can optionally further include an LVMOS transistor 52. The first LDMOS transistor 52 includes a first gate electrode 28 disposed on the substrate 10, a first STI 58 embedded in the substrate 10 and disposed at an edge of the first gate electrode 28 and two first doping regions 42 respectively disposed at one side of the first STI 58 and one side of the first gate electrode 28. The second LDMOS transistor 64 includes a second gate electrode 18, a second STI 60 embedded in the substrate 10 and disposed at an edge of the second gate electrode 18 and two second doping regions 44 respectively disposed at one side of the second STI 60 and one side of the second gate electrode 18. It is noteworthy that the second STI 60 is deeper than the first STI 58. For example, the first STI 60 is about 1000 angstroms, and the second STI 58 is about 2000 angstroms.

The third LDMOS transistor 50 includes a third gate electrode 20, a third STI 12 embedded in the substrate 10 and disposed at an edge of the third gate electrode 20 and two third doping regions 46 respectively disposed at one side of the third STI 12 and one side of the third gate electrode 20. The LVMOS transistor 52 includes a low voltage gate electrode 22, wherein two fourth doping regions 48 are disposed at two sides of the low voltage gate electrode 22. At least one fourth STI 14 is embedded in the substrate 10 within the low voltage device region B. The third STI 12 has substantially the same depth as the fourth STI 14. The third STI 12 is deeper than the second STI 60. For instance, the third STI 12 is about 3500 angstroms.

The first STI 58 includes a first trench 30 embedded in the substrate 10 and a filling layer 56 such as silicon oxide filling in the first trench 30. The second STI 60 includes a second trench 32 embedded in the substrate 10 and the filling layer 56 filling in the second trench 32. Besides silicon oxide, the filling layer 56 can be other suitable insulating layers. It is noteworthy that the filling layer 56 not only fills in the first trench 30 and the second trench 32 but also covers the first LDMOS transistor 62, the second LDMOS transistor 64, the third LDMOS transistor 50 and the LVMOS transistor 52. The filling layer 56 therefore not only serves as filling for the first STI 58 and the second STI 60, but also serves as an interlayer dielectric for the first LDMOS transistor 62, the second LDMOS transistor 64, the third LDMOS transistor 50 and the LVMOS transistor 52. An etching stop layer 54 is disposed in and contacts the first trench 30 and the second trench 32. The etching stop layer 54 extends out from the first trench 30 and the second trench 32 to cover the first gate electrode 28, the second gate electrode 18, the third electrode 20 and the low voltage electrode 22.

Dielectric layers 24 are respectively disposed between the first gate electrode 28 and the substrate 10, the second gate electrode 18 and the substrate 10, the third gate electrode 20 and the substrate 10, and the low voltage gate electrode 22 and the substrate 10. The first gate electrode 28, the second gate electrode 18, the third gate electrode 20 and the low voltage gate electrode 22 are preferably made of polysilicon. The dielectric layers 24 within the high voltage device region A are thicker than the dielectric layers 24 within the low voltage device region B.

Each of the dielectric layers 24 may be independently selected from insulating materials such as silicon oxide, silicon nitride, silicon carbide nitride, silicon oxynitride, high-k dielectrics or any combination thereof. Furthermore, there are spacers 40 respectively disposed at two sides of the first gate electrode 28, the second gate electrode 18, the third gate electrode 20, the low voltage gate electrode 22, two sides of the first trench 30 and two sides of the second trench 32. One of the spacers 40 on the first gate electrode 28 extends to one sidewall of the first trench 30, so that the first gate electrode 28 and the first trench 30 share one of the spacers 40. One of the spacers 40 on the second gate electrode 18 extends to one sidewall of the second trench 32, so that the second gate electrode 18 and the second trench 32 share one of the spacers 40. The spacers 40 can be multiple layers or single layer, and the spacers may be silicon oxide, silicon nitride, silicon carbide nitride or silicon oxynitride.

A first lightly doped well 66 and a well 68 are disposed around one of the first doping regions 42. A second lightly doped well 70 and a well 72 are disposed around one of the second doping regions 44. A third lightly doped well 74 and a well 76 are disposed around one of the third doping regions 46.

The first drift region 34, the second drift region 36, the third drift region 38, the first doping region 42, the second doping region 44, and the third doping region 46 are of a first conductive type. The first lightly doped well 66, the well 68, the second lightly doped well 70, a well 72, the third lightly doped well 74, and the well 76 are of a second conductive type. The first conductive type is different from the second conductive type. The first conductive type may be n-type or p-type. The second conductive type may be p-type or n-type.

Because the third STI 12 is deeper than the second STI 60, and the second STI 60 is deeper than the first STI 58, the third LDMOS transistor 50 can sustain a higher breakdown voltage than the second LDMOS transistor 64. The second LDMOS transistor 64 can sustain a higher breakdown voltage than the first LDMOS transistor 62. For example, the breakdown voltage of the first LDMOS transistor 62 is between 10 to 20 volts. The breakdown voltage of the second LDMOS transistor 64 is between 20 to 30 volts. The breakdown voltage of the third LDMOS transistor 50 is above 30 volts.

The method of the present invention provides an easy way to fabricate three LDMOS transistors having different depths of STIs. By taking the polysilicon for making the gate electrode as a sacrificial layer, the depth of the STI can be adjusted to become shallower than another STI which does not utilize the sacrificial layer during the intermediate manufacturing stage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a high voltage device, comprising:
   providing a substrate comprising a high voltage device region and a low voltage device region;
   forming a preliminary first gate electrode and a second gate electrode on the substrate within the high voltage device region;
   after forming the preliminary first gate electrode and the second gate electrode, forming a first trench and a second trench embedded in the substrate and a first gate electrode, wherein the second trench is deeper than the first trench, the first trench is under an edge of the first gate electrode and the second trench is under an edge of the second gate electrode; and
   forming an insulating layer to fill in the first trench and the second trench to form a first STI and a second STI.

2. The method of fabricating a high voltage device of claim 1, further comprising:
   before filling up the first trench and the second trench and after forming the first trench and the second trench, forming first doping regions and second doping regions, wherein the first doping regions are respectively disposed in the substrate at one side of the first trench and one side of the first gate electrode, and the second doping regions are respectively disposed in the substrate at one side of the second trench and one side of the second gate electrode.

3. The method of fabricating a high voltage device of claim 1, further comprising:
   forming a first drift region surrounding the first trench, and forming a second drift region surrounding the second trench.

4. The method of fabricating a high voltage device of claim 1, wherein the first gate electrode is polysilicon, and the second gate electrode is polysilicon.

5. The method of fabricating a high voltage device of claim 1, wherein the insulating layer covers the first gate electrode and the second gate electrode.

6. The method of fabricating a high voltage device of claim 1, wherein the second STI is deeper than the first STI.

7. The method of fabricating a high voltage device of claim 1, further comprising:
   before forming the first trench and the second trench, forming a patterned mask layer covering part of the substrate, part of the preliminary first gate electrode and the second gate electrode, wherein part of the preliminary first gate electrode and the substrate beside the second gate electrode are exposed through the patterned mask layer.

8. The method of fabricating a high voltage device of claim 7, wherein the steps of forming the first trench and the second trench comprise:
   performing an etching process to simultaneously etch the exposed preliminary first gate electrode and the substrate beside the second gate electrode by taking the patterned mask layer as a mask, wherein after the exposed preliminary first gate electrode is entirely removed and the first gate electrode is formed, the etching process continues to etch the substrate beside the first gate electrode while etching the substrate beside the second gate electrode; and
   removing the patterned mask layer.

9. The method of fabricating a high voltage device of claim 1, further comprising:
   forming a low voltage gate electrode on the substrate within the low voltage device region while forming the preliminary first gate electrode and the second gate electrode on the substrate.

10. The method of fabricating a high voltage device of claim 9, further comprising:
    before forming the low voltage gate electrode, forming a third STI in the substrate within the low voltage device region.

11. The method of fabricating a high voltage device of claim 10, wherein the third STI is deeper than the second STI.

* * * * *